United States Patent [19]

Dru et al.

[11] 4,049,978

[45] Sept. 20, 1977

[54] MOS HIGH CURRENT DRIVE CIRCUIT

[75] Inventors: Luke William Dru, Santa Ana; Yun Sheng Hwang, Tustin, both of Calif.

[73] Assignee: Western Digital Corporation, Newport Beach, Calif.

[21] Appl. No.: 652,398

[22] Filed: Jan. 26, 1976

[51] Int. Cl.$^2$ .................. H03K 19/00; H03K 1/00
[52] U.S. Cl. ................................ 307/270; 307/205; 307/DIG. 4; 307/251
[58] Field of Search ............... 307/270, 279, 214, 305, 307/205, D4

[56] References Cited

U.S. PATENT DOCUMENTS

| | | |
|---|---|---|
| 3,619,670 | 11/1971 | Heimbigner .................. 307/251 |
| 3,889,135 | 6/1975 | Nomiya et al. ............... 307/D4 |
| 3,912,948 | 10/1975 | Bapat .......................... 307/D4 |

*Primary Examiner*—Stanley D. Miller, Jr.
*Assistant Examiner*—B. P. Davis

[57] ABSTRACT

A drive circuit is disclosed which incorporates a plurality of drive current boosting circuits together with a basic drive circuit. The boosting circuits increase the amount of drive current available to drive other devices or circuitry. The boosting circuits comprise a plurality of boot strap inverter circuits coupled appropriately to the drive circuit. The sequence of operation of the boot strap inverter circuits and the basic drive circuit is controlled by timing signals so as to maximize the available drive current.

8 Claims, 3 Drawing Figures

4,049,978

MOS HIGH CURRENT DRIVE CIRCUIT

FIELD OF INVENTION

This invention relates to current drive circuits and more specifically to high current MOS drive circuits.

DESCRIPTION OF THE PRIOR ART

In the digital art it is frequently necessary to provide a drive circuit between the relatively low power logic circuits and the driven load. The drive circuit performs the dual function of isolating the logic circuits from the load and making available more power to drive the load. However, since large scale integration (LSI) metal oxide semiconductor (MOS) drive circuits usually provide relatively low power, they usually perform only an isolation-type function.

In systems which use LSI MOS devices and which drive relatively high power loads, a separate bipolar device is connected to the output of the LSI MOS drive circuit to provide a high drive current. The use of a bipolar device is, however, disadvantageous for a number of reasons. The first is that the bipolar device increases the total number of parts used in the system and thereby increases inventory and assembly costs. Another disadvantage is that in miniaturized systems additional space is required for the bipolar device in a situation where space is at a premium. In order to overcome the disadvantages of having to add a bipolar device to drive a high current load, the supply voltage to the LSI MOS device is increased to provide additional drive. However, in applications where the supply voltage is severely limited, increasing the supply voltage is not a viable solution.

Accordingly, it is a general object of the present invention to provide a drive circuit capable of providing a high current drive.

It is another object of the present invention to provide a drive circuit which is feasible to fabricate as a LSI MOS device.

It is yet another object of the present invention to provide a LSI MOS drive circuit which requires no external components.

It is still another object of the present invention to provide a MOS drive circuit which will supply relatively high current drives with a limited supply voltage.

It is another object of the present invention to provide a drive circuit which is small in physical dimensions.

SUMMARY OF THE INVENTION

In keeping with the principles of the present invention, the objects are accomplished with the unique combination of a basic drive circuit and a plurality of drive current boosting circuits. The drive current boosting circuits comprise a plurality of boot strap inverter circuits of a type common in the art. The boot strap inverter circuits are coupled to the basic drive circuit in such a way that the amount of drive current available to drive other devices or circuitry is increased. Furthermore, the operation of both the boot strap inverter circuits and the basic drive circuit is controlled by timing signals. The timing signals are applied to the boot strap inverters and the drive circuit in such a manner as to maximize the available drive current from the drive circuit.

BRIEF DESCRIPTION OF THE DRAWINGS

The above-mentioned and other features and objects of the present invention will become more apparent by reference to the following description taken in conjunction with the accompanying drawings, wherein like reference numerals denote like elements, and in which.

DESCRIPTION OF THE PREFERRED EMBODIMENT

Figure 1:
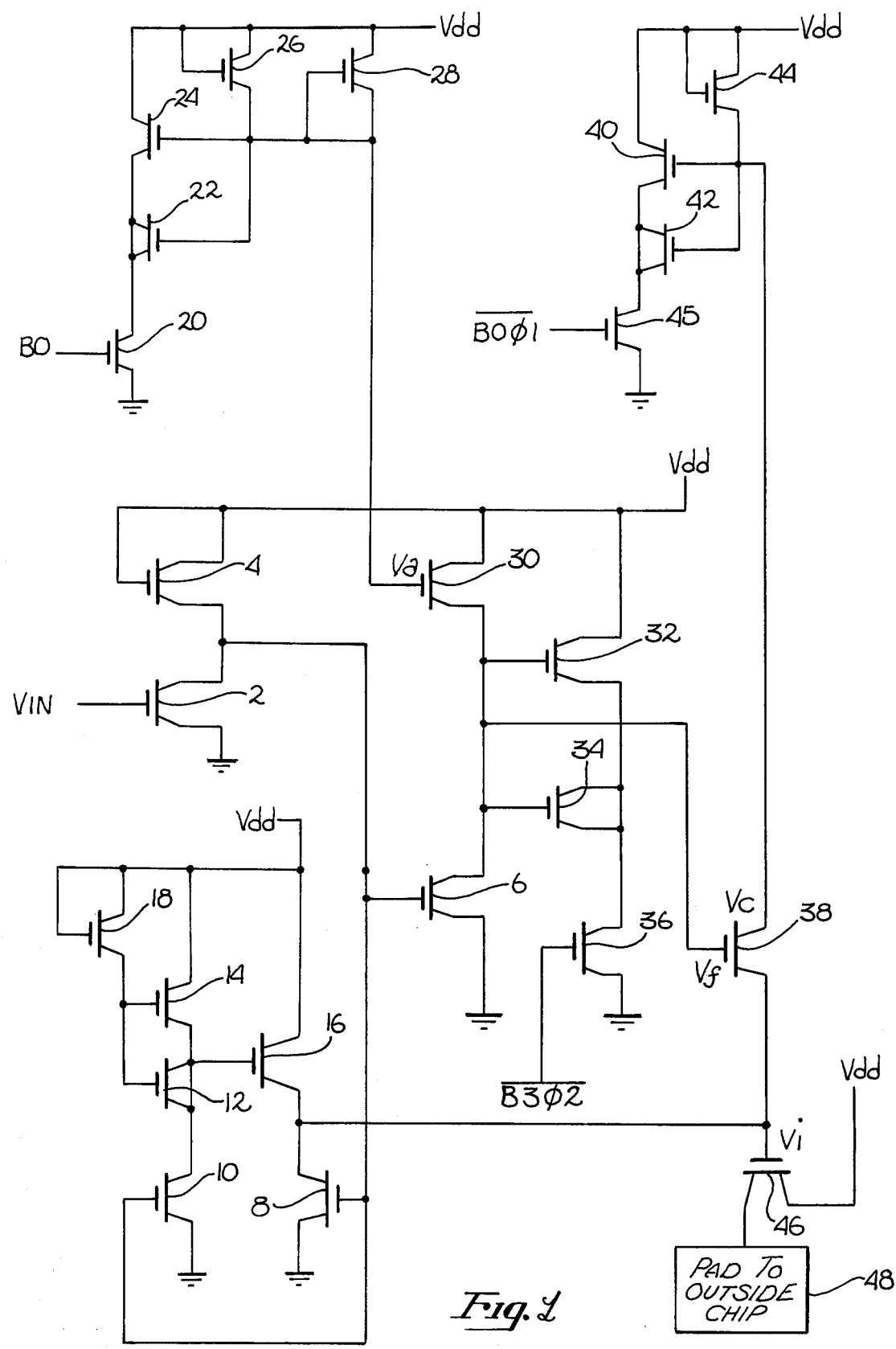
FIG. 1 is a schematic diagram of a MOS current drive circuit in accordance with the teachings of the present invention.

Referring more specifically to the drawings, FIG. 1 is a schematic diagram of a MOS current drive circuit in accordance with the teachings of the present invention. The current drive circuit includes a MOS 2 having a gate, source and drain electrodes. Timing signal $V_{in}$ is connected to the gate of MOS 2. The drain and source of MOS 2 are coupled respectively to the source of MOS 4 and ground. The gate electrode and drain electrode of MOS 4 are coupled together. Furthermore, the source electrode of MOS 4 is coupled to the gate electrode of MOS 6, MOS 8 and MOS 10.

The drain and source electrode of MOS 10 are coupled respectively to the source electrode of MOS 12 and ground. The drain electrode of MOS 12 is coupled to the source electrode of MOS 14, the source electrode of MOS 12 and the gate electrode of MOS 16. The gate electrode of MOS 12 is coupled to the gate of MOS 14 and the source of MOS 18. Furthermore, the gate of MOS 18, the drain electrode of MOS 18, the drain electrode of MOS 14 and the drain electrode of MOS 16 are coupled together and the combination is coupled to a negative source of voltage represented by $V_{dd}$. In other words, MOS 10, 12, 14 and 18 are coupled together in the form of a boot strap inverter circuit. The drain and source electrodes of MOS 8 are coupled respectively to the source of MOS 16 and ground.

Timing signal BO is coupled to the gate electrode of MOS 20. The drain and source electrodes of MOS 20 are coupled respectively to the source electrode of MOS 22 and ground. Furthermore, the drain electrode of MOS 22 is coupled to both the source electrode of MOS 24 and the source electrode of MOS 22. Furthermore, the gate electrodes of MOS 22 and MOS 24, the source electrode of MOS 26, the gate and source electrodes of MOS 28 and the gate electrode of MOS 30 are coupled together. The drain electrodes of MOS 24 and MOS 28, and the gate and drain electrodes of MOS 26 are coupled together and the junction thereof is coupled to a source of negative voltage represented by $V_{dd}$. Furthermore, MOS 20, 22, 24, 26 and 28 taken together form a boot strap inverter.

The source electrodes of MOS 30 and the drain electrode of MOS 6 and the gate electrodes of MOS 32 and MOS 34 are coupled together. The drain electrodes of MOS 4, MOS 30 and MOS 32 are coupled together and the junction thereof is coupled to a source of negative voltage represented by $V_{dd}$. The source electrode of MOS 32 is coupled to both the source and drain of MOS 34. The drain and source electrodes of MOS 36 are coupled respectively to the source of MOS 34 and ground. The source electrode of MOS 6 is coupled to ground. Furthermore, the timing signal $\overline{B3\phi2}$ is coupled to the gate of MOS 36.

The gate and source electrodes of MOS 38 are coupled respectively to the drain electrode of MOS 6 and the drain electrode of MOS 8. Furthermore, the source electrode of MOS 44 and the gate electrodes of MOS 40 and MOS 42 are coupled together and the junction thereof is coupled to the drain electrode of MOS 38. The drain electrode of MOS 40 and the gate and drain electrodes of MOS 44 are coupled together and the junction thereof is coupled to a source of negative voltage represented by $V_{dd}$. In addition, the source electrode of MOS 40 is coupled to both the source and drain electrodes of MOS 42. Also, the drain, gate and source electrodes of MOS 45 are coupled respectively to the source electrode of MOS 42, timing signal $\overline{B0\phi1}$ and ground. Also, the combination of MOS 40, 42, 44 and 45 taken together form a boot strap inverter.

Furthermore, the source electrode of MOS 38 is coupled to the gate electrode of MOS 46. The drain and source electrodes of MOS 46 are coupled respectively to a source of negative voltage represented by $V_{dd}$ and to a pad electrode 48.

In practice, the timing signals $\overline{B0\phi1}$, $\overline{B3\phi2}$, B0 and $V_{in}$ can be generated by standard digital circuitry available in the art from clock pulse signals $\phi1$ and $\phi2$. Furthermore, the pad 48 may be any type of electrode commonly used in the LSI MOS art.

Figure 2:
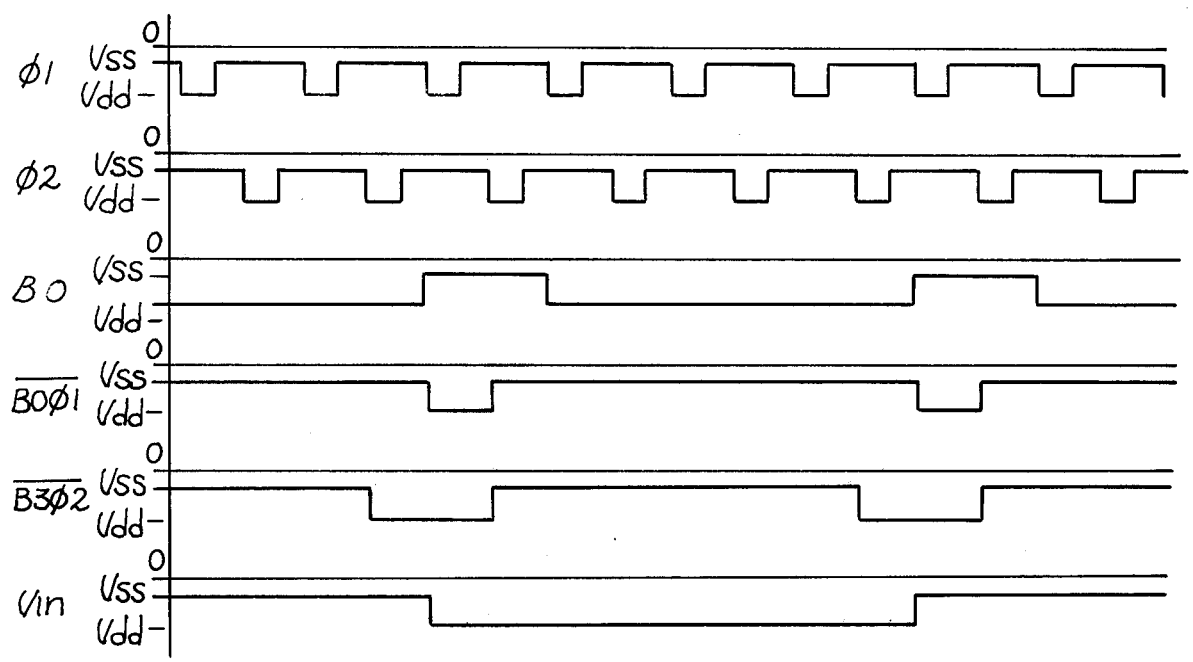
FIG. 2 is a graphical represention of typical timing signals applied to the drive circuit of FIG. 1.
Figure 3:
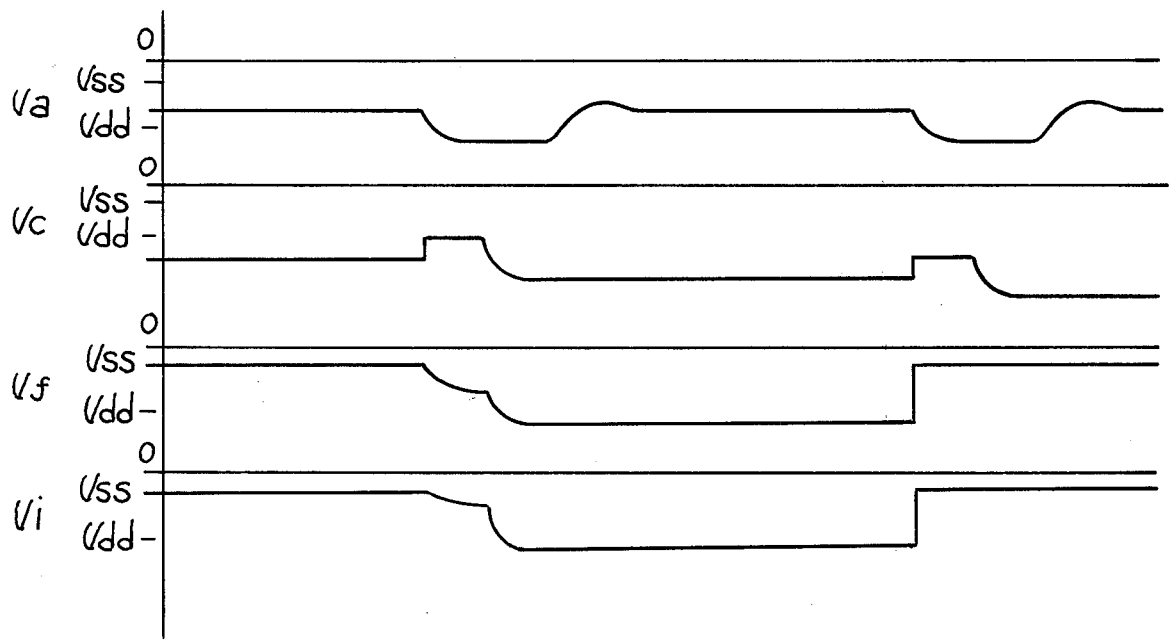
FIG. 3 is a graphical representation of typical wave forms at selected points in the drive circuit of FIG. 1.

Referring now to FIGS. 1, 2 and 3, assume that the timing signals B0, $\overline{B0\phi1}$, $\overline{B3\phi2}$ and $V_{in}$ are applied to the current driver circuit of FIG. 1. Furthermore, the voltages $V_a$, $V_c$, $V_f$ and $V_i$ are defined respectively as the voltage at the gate of MOS 30, the voltage at the drain of MOS 38, the voltage at the gate electrode of MOS 38, and the voltage at the gate electrode of MOS 46.

In operation, when timing signal B0 is at $V_{dd}$, $V_a$ is precharged to a voltage of $V_{dd}$ minus the threshold of MOS 26. When the timing signal B0 changes from minus $V_{dd}$ to minus $V_{ss}$, the voltage at the source electrode of MOS 24 goes negative towards minus $V_{dd}$. When the voltage at the source of MOS 24 goes toward minus $V_{dd}$, MOS 22 acts as a capacitor to charge $V_a$ to a voltage more negative than minus $V_{dd}$, as shown in FIG. 3, and allows the voltage at the source of MOS 24 to charge to a voltage of minus $V_{dd}$. The capacity of MOS 22 is sufficient to charge all of the load that is attached to the source of MOS 28.

When timing signal $\overline{B0\phi1}$ is at minus $V_{dd}$, $V_c$ is at a minimum voltage of minus $V_{dd}$ minus the threshold voltage of MOS 44. When $\overline{B0\phi1}$ changes from minus $V_{dd}$ to minus $V_{ss}$ at some predetermined time after B0 changes from minus $V_{dd}$ to minus $V_{ss}$, the voltage at the source of MOS 40 charges toward minus $V_{dd}$ allowing MOS 42 to charge $V_c$. As the voltage at the source of MOS 40 charges toward minus $V_{dd}$, $V_c$ charges to a voltage more negative than minus $V_{dd}$ as shown in FIG. 3. The capacity of MOS 42 is large enough to charge all of the load that is attached to the source of MOS 44.

If the timing signal $V_{in}$ is at minus $V_{ss}$ at the instant in time just before timing signal B0 changes from minus $V_{dd}$ to minus $V_{ss}$, the voltage at the drain of MOS 2 is at minus $V_{dd}$, minus the threshold voltage of MOS 4. When timing signal $V_{in}$ changes from minus $V_{ss}$ to minus $V_{dd}$ at the same time that B0 changes from minus $V_{dd}$ to minus $V_{ss}$, the voltage at the drain of MOS 2 goes toward minus $V_{ss}$. When the voltage at the drain of MOS 2 charges toward minus $v_{ss}$, the voltage at the drain of MOS 6 charges toward minus $V_{dd}$.

When $\overline{B3\phi2}$ changes from minus $V_{dd}$ to minus $V_{ss}$ at the same time $\overline{B0\phi1}$ changes from minus $V_{dd}$ to minus $V_{ss}$ and since $V_a$ is already precharged to a value more negative than minus $V_{dd}$, $V_f$ is boosted to a voltage more negative than $V_c$.

Furthermore, when the voltage at the drain of MOS 2 changes from minus $V_{dd}$ to minus $V_{ss}$ at the same time that timing signal B0 changes from minus $V_{dd}$ to minus $V_{ss}$, the voltage at the gate of MOS 16 changes from minus $V_{ss}$ to minus $V_{dd}$. When the voltage at the gate of MOS 16 is minus $V_{dd}$ and the voltage at the source of MOS 2 is minus $V_{ss}$, $V_i$ charges to minus $V_{dd}$ minus the threshold voltage of MOS 16 as shown in FIG. 3. Furthermore, since $V_f$ is pumped to a value more negative than $V_c$, $V_c$ is coupled into $V_i$ thereby giving MOS 46 a higher voltage and accordingly increasing the available drive current.

It should be apparent that the MOS high current drive circuit previously described can be implemented with N-channel MOS devices and a positive supply voltage of plus $V_{dd}$ without departing from the spirit and scope of the present invention.

In all cases it is understood that the above-described embodiment is merely illustrative of but a small number of the many possible specific embodiments which can represent applications of the principles of the present invention. Numerous and varied other arrangements can be readily devised in accordance with these principles by those skilled in the art without departing from the spirit and scope of the invention.

We claim:

1. A high current drive circuit of the type which is controlled by timing signals and powered by a constant source of direct current voltage, comprising:

first and second boot strap inverter circuits, said boot strap inverters being responsive to said timing signals, each having a corresponding output;

a current drive circuit having inputs coupled to said corresponding outputs of said first and second boot strap inverter circuits, said drive circuit arranged and configured such that in response to said timing signals the maximum outputs from said first and second boot strap inverter circuits are coupled to the output of said drive circuit;

wherein said first bootstrap inverter circuit includes first through fifth metal oxide semiconductor devices, each having gate, source and drain electrodes, said drain electrodes of said first, second and third devices and said gate electrode of said third device being coupled to said source of direct current voltage, said source electrodes of said first and fourth devices and said drain electrodes of said fourth and fifth devices being coupled together, said gate electrodes of said first, second, and fourth devices and said source electrode of said second and third devices being coupled together and forming the output of said first bootstrap inverter, and said gate electrode and source electrode of said fifth device being coupled respectively to one of said timing signals and ground.

2. A high current drive circuit according to claim 1 wherein said second boot strap inverter circuit comprises first through fourth metal oxide semiconductor devices, each having gate, source and drain electrodes, said drain electrodes of said first and second devices and said gate electrode of said second device being coupled to said source of direct current voltage, said source electrodes of said first and third devices and said drain electrodes of said third and fourth devices being coupled together, said gate electrode and said source electrode of said fourth device being coupled respectively to one of said timing signals and ground, and said gate electrodes of said first and third device and said source electrode of said second device being coupled together and forming an output of said second boot strap inverter.

3. A high current drive circuit of the type which is controlled by first, second, third, and fourth timing signals and powered by a constant source of direct current voltage, comprising:

a first boot strap inverter circuit having an input and an output, said first circuit generating an output pulse of voltage greater in magnitude than said voltage source, in response to said first timing signal;

a second boot strap inverter circuit having an input and an output, said second circuit generating an output pulse of voltage greater in magnitude than said voltage source in response to said second timing signal;

a third boot strap inverter having an input and an output, said second circuit generating an output pulse of voltage in response to said third timing signal; and first through ninth metal oxide semiconductor devices, each having gate, source, and drain electrodes, said drain electrodes of said first, third, fifth, and ninth devices being coupled to said source of voltage, said gate electrodes of said fifth, sixth, and eighth devices and said source electrode of said third device and said drain electrode of said fourth device being coupled together, said source electrodes of said fifth and sixth devices and said drain electrodes of said sixth and seventh devices being coupled together, said source electrodes of said first and eighth devices and said drain electrode of said second device and said gate electrode of said ninth device being coupled together, said gate electrodes of said second and fourth devices being coupled to said third timing signal, said gate electrodes of said first and third devices being coupled respectively to said outputs of said third circuit and said first circuit, said source electrodes of said second, fourth, and seventh devices being coupled to a common terminal, said gate electrode of said seventh device being coupled to said fourth timing signal, said drain electrode of said eighth device being coupled to the output of said second circuit, and said source electrode being the output of said drive circuit whereby said first, second, third and fourth timing signals occur at points in time to maximize the available output drive current.

4. A current drive circuit according to claim 3 wherein said first boot strap inverter circuit comprises:

first through fifth metal oxide semiconductor devices, each having gate, source and drain electrodes, said drain electrodes of said first, second and third devices and said gate electrode of said third device being coupled to said source of direct current voltage, said source electrodes of said first and fourth devices and said drain electrodes of said fourth and fifth devices being coupled together, said gate electrodes of said first, second, and fourth devices and said source electrode of said second and third devices being coupled together and forming the output node of said first boot strap inverter, and said gate electrode and source electrode of said fifth device being coupled respectively to said first timing signal and ground.

5. A high current drive circuit according to claim 4 wherein said second boot strap inverter circuit comprises first through fourth metal oxide semiconductor devices, each having gate, source and drain electrodes, said drain electrodes of said first and second devices and said gate electrode of said second device being coupled to said source of direct current voltage, said source electrodes of said first and third devices and said drain electrodes of said third and fourth devices being coupled together, said gate electrode and said source electrode of said fourth device being coupled respectively to said second timing signal and ground, and said gate electrodes of said first and third device and said source electrode of said second device being coupled together and forming an output of said second boot strap inverter.

6. A drive circuit having a source of clock signals and at least one input signal coupled thereto comprising:

a clocked current drive circuit including a first MOS output device and a clocked bootstrapped inverter drive circuit, said first MOS output device having a gate electrode, input and output terminals, said gate electrode being coupled to the output of said clocked bootstrapped inverter drive circuit, said inverter drive circuit being responsive to said input signal and having its input coupled thereto;

a first clocked bootstrapped inverter circuit having its output coupled to said inverter drive circuit to initiate and clock the output of said inverter drive circuit; and a second clocked bootstraped inverter circuit having its output coupled to the input terminal of said first MOS output device.

7. The drive circuit of claim 6 further comprising:

a second MOS output device having its gate electrode coupled to said output terminal of said first MOS output device; and a third clocked bootstrapped inverter circuit having an input coupled to and an output responsive to said input signal said output being coupled to said gate electrode of said second MOS output device.

8. The drive circuit of claim 6 wherein said first and second clock bootstrapped inverter circuit is coupled to a plurality of said clocked current drive circuits, each said current drive circuit having a corresponding said input signal coupled thereto.

* * * * *